United States Patent
Sun et al.

(10) Patent No.: US 10,630,235 B2
(45) Date of Patent: Apr. 21, 2020

(54) INTERNAL PROTECTION CIRCUIT STRUCTURE OF PHOTOVOLTAIC MODULES HAVING INDEPENDENT POWER GENERATING UNIT

(71) Applicant: Tongwei Solar Energy(Hefei) Co.,Ltd., Hefei (CN)

(72) Inventors: Jun Sun, Hefei (CN); Chengyin Jiang, Hefei (CN); Fushen Zhou, Hefei (CN); Taihong Xie, Hefei (CN); Yi Xie, Hefei (CN)

(73) Assignee: TONGWEI SOLAR ENERGY (HEFEI) CO., LTD., Hefei (CN)

( * ) Notice: Subject to any disclaimer, the term of this patent is extended or adjusted under 35 U.S.C. 154(b) by 221 days.

(21) Appl. No.: 15/575,819

(22) PCT Filed: Aug. 28, 2017

(86) PCT No.: PCT/CN2017/099226
§ 371 (c)(1),
(2) Date: Nov. 21, 2017

(87) PCT Pub. No.: WO2019/041079
PCT Pub. Date: Mar. 7, 2019

(65) Prior Publication Data
US 2019/0238089 A1    Aug. 1, 2019

(51) Int. Cl.
*H02S 40/34* (2014.01)
*H01L 31/044* (2014.01)
*H01L 31/02* (2006.01)

(52) U.S. Cl.
CPC .......... *H02S 40/34* (2014.12); *H01L 31/0201* (2013.01); *H01L 31/02021* (2013.01); *H01L 31/044* (2014.12); *Y02E 10/50* (2013.01)

(58) Field of Classification Search
CPC ... H02S 40/34; H02S 31/044; H02S 31/02021
See application file for complete search history.

(56) References Cited

U.S. PATENT DOCUMENTS

| 8,325,059 | B2 * | 12/2012 | Rozenboim | ............ | G08C 19/00 |
|---|---|---|---|---|---|
| | | | | | 136/243 |
| 2016/0141435 | A1 * | 5/2016 | Sridhara | ............ | H02J 3/383 |
| | | | | | 136/244 |

FOREIGN PATENT DOCUMENTS

| CN | 102306673 A | 1/2012 |
|---|---|---|
| CN | 102339901 A | 2/2012 |
| CN | 206259900 U | 6/2017 |

* cited by examiner

*Primary Examiner* — Jayne L Mershon
(74) *Attorney, Agent, or Firm* — Bayramoglu Law Offices LLC

(57) ABSTRACT

The present invention discloses an internal protection circuit structure of photovoltaic modules having independent power generating unit, which includes a plurality of solar cells. The plurality of solar cells is combined to form a power generating unit A and a power generating unit B. Polarities of the upper ends of the substrings of solar cell are positive, negative, positive, negative, positive, and negative sequentially from the first column of A to the sixth column of A. Polarities of the lower ends of the substrings of solar cell are positive, negative, positive, negative, positive, and negative sequentially from the first column of B to the sixth column of B. Moreover, the busbar is provided with three separate junction boxes.

3 Claims, 2 Drawing Sheets

INTERNAL PROTECTION CIRCUIT STRUCTURE OF PHOTOVOLTAIC MODULES HAVING INDEPENDENT POWER GENERATING UNIT

CROSS REFERENCE TO RELATED APPLICATIONS

This application is the national phase entry of International Application PCT/CN2017/099226, filed on Aug. 28, 2017, the entire content of which is incorporated herein by reference.

TECHNICAL FIELD

The present invention relates to the field of application technology of solar cell module encapsulation of solar crystalline silicon wafer, particularly to an internal protection circuit structure of photovoltaic modules having independent power generating unit.

BACKGROUND

With the accelerating energy consumption of conventional fossil fuels such as coal, oil, natural gas, etc., the eco-environment is continuously deteriorating. Especially, due to the greenhouse gas emissions, the global climate change is getting worse and worse. Therefore, the sustainable development of human society has been seriously threatened. Countries all around the world have formulated their own energy development strategies to cope with the limitations of conventional fossil fuels resources and the environmental problems caused by the development and utilization of the conventional fossil fuels. Solar energy has become one of the most important renewable energy sources due to its reliability, safety, universality, long service life, environmental friendliness and resource sufficiency; and is expected to become the dominant energy of the future global electricity supply.

Considering the fact that green solar energy has been promoted and used vigorously, the components of the photovoltaic modules are encapsulated based on the electrical principle of low current and low loss (i.e., the power loss of photovoltaic modules is directly proportional to the square of the working current) through the slicing process (i.e., performing one-half laser cutting on conventional 6-inch solar cells) to obtain two separate complete power generating units, so as to increase the output power and electricity generating efficiency. Currently, the first-class photovoltaic module manufacturers in China such as Trina Solar, Canadian Solar, Jinko Solar, and JA Solar have all launched half-cell photovoltaic modules. Among them, manufacturers like Canadian Solar etc. have already sold the half-cell components in large numbers in the market and have earned an objective sales profit. Based on the consideration of the characteristics of the assembly line of existing manufacturing process, most of the internal protection circuits of the conventional half-cell photovoltaic modules available in the market are designed such that two strings are connected in parallel, and then three strings are connected in series. Otherwise, the two strings are connected in parallel, and then five strings are connected in series, wherein a plurality of diodes are connected in bypass to form a bus circuit (taking the 60-cell mode for an example). The final product, i.e. the half-cell photovoltaic modules, can achieve almost the same output voltage and current as those of the conventional photovoltaic modules, without significant impact or extra cost on the system-side application. Moreover, compared to the conventional product, the output power gain of the final product increases by about 5 watts, and the efficiency thereof increases by about 0.3%.

Generally, the 60-cell mode is taken as an example for the design of internal protection circuit of the existing half-cell photovoltaic modules. If the vertical outgoing is taken for an example, two strings are connected in parallel, and then three strings are connected in series, wherein two or four diodes are connected in bypass. If the lateral outgoing is taken for an example, two strings are connected in parallel, and then five strings are connected in series, wherein four diodes are connected in bypass. Considering the factors such as the compatibility of the assembly line of the manufacturing process of the conventional photovoltaic modules, the performance and reliability of the final product, etc., the above two kinds of internal protection circuit designs have some defects and drawbacks.

Taking the vertical outgoing as an example (i.e. 20 half-cells are connected to each other to form a substring power generating unit), two bypass diodes are used to protect the solar cells. If one substring in three substrings is shadowed to be put in the reverse bias state, the diodes connected in parallel to the shadowed substring are turned on and start to work. However, in reality, only one substring (40 half-cells in total) works effectively to generate electricity. Two-third of the substrings of the solar cell (80 half-cells in total) are bypassed such that the power generation capacity thereof is lost. In this case, the actual utilization rate of electricity generation of the half-cells is about 33% in total. The obvious disadvantages are as follows. In view of the electrical power output of the product, the levelized cost of electricity (LOCE) of the system side application of photovoltaic modules will be seriously affected. Moreover, the risk of failure in the reliability test of the products will be greatly increased. Therefore, the performance of the products is unstable, and the products are likely to fail in the environment test such as the typical hot spot test.

Taking the lateral outgoing as an example (i.e. 12 half-cells are connected to each other to form a substring power generating unit), four bypass diodes are used to protect the solar cells. If one substring in five substrings is shadowed to be put in the reverse bias state, the diodes connected in parallel with the shadowed substring are turned on and start to work. At this time, actually, only three-fifth substrings (72 half-cells in total) work effectively to generate electricity. Two-fifth of the substrings of the solar cell (48 half-cells in total) are bypassed such that the power generation capacity thereof is lost, and the actual utilization rate of electricity generation of the half-cells is about 60%. The obvious disadvantages are as follows. In view of the electrical power output of the product, compared to the above vertical outgoing method, the power generation capacity of the lateral outgoing method increases by about 27%. However, the actual power generation capacity of the system side of the modules is greatly reduced. Meanwhile, the failure rate of the environment test is also increased.

SUMMARY OF THE INVENTION

The objective of the present invention is to provide an internal protection circuit structure of photovoltaic modules having independent power generating unit, so as to solve the problems raised in the background.

To achieve the above objective, the present invention provides the following technical solutions.

An internal protection circuit structure of photovoltaic modules having independent power generating unit includes a plurality of solar cells. The plurality of solar cells are combined to form a power generating unit A and a power generating unit B. The power generating unit A is equally divided into six columns including a first column of A, a second column of A, a third column of A, a fourth column of A, a fifth column of A, and a sixth column of A, sequentially.

The power generating unit B is equally divided into six columns including a first column of B, a second column of B, a third column of B, a fourth column of B, a fifth column of B, and a sixth column of B, sequentially. The positive and negative electrodes of each column of solar cells are sequentially connected in series to form a substring of the solar cell.

Polarities of the upper ends of the substrings of solar cells are positive, negative, positive, negative, positive, and negative sequentially from the first column of A to the sixth column of A. The upper end of the first column of A and the upper end of the second column of A are connected to each other. The upper end of the third column of A and the upper end of the fourth column of A are connected to each other. The upper end of the fifth column of A and the upper end of the sixth column of A are connected to each other.

Polarities of the lower ends of the substrings of solar cells are positive, negative, positive, negative, positive, and negative sequentially from the first column of B to the sixth column of B. The lower end of the first column of B and the lower end of the second column of B are connected to each other. The lower end of the third column of B and the lower end of the fourth column of B are connected to each other. The lower end of the fifth column of B and the lower end of the sixth column of B are connected to each other.

Six outgoing lines extend from the lower ends of the substrings of solar cells sequentially from the first column of A to the sixth column of A. Six outgoing lines extend from the upper ends of the sub strings of solar cells sequentially from the first column of B to the sixth column of B. The six outgoing lines of the power generating unit A and the six outgoing lines of the power generating unit B are connected to the same busbar. The busbar is provided with three separate junction boxes.

Preferably, each separate junction box is provided with a diode.

Preferably, the three junction boxes are respectively arranged in the following positions, i.e., a position between the first column of A and the second column of A, a position between the third column of A and the fourth column of A, and a position between the fifth column of A and the sixth column of A.

Compared to the prior art, the present invention has the following advantages.

The unique design of the internal encapsulation protection circuit of the present invention performs a protection function for the encapsulation of sliced photovoltaic module. By doing so, the low practical utilization rate of the total electricity generation of the half-cell can be effectively increased. Moreover, with encapsulation of the cutting in half process, the harms caused by hot spot effect to the practical application of the modules can be greatly reduced. Furthermore, the design of the protection circuit is practical for mass production without additional investment costs. In the key part of the circuit design, the polarities of the upper ends of the substrings of solar cells of the power generating unit A are "positive, negative, positive, negative, positive, and negative", and the polarities of the lower ends are "negative, positive, negative, positive, negative, and positive". The polarities of the lower ends of the substrings of the solar cells of the power generating unit B are "positive, negative, positive, negative, positive, and negative", and the polarities of the upper ends are "negative, positive, negative, positive, negative and positive". Moreover, the power generating unit A and the power generating unit B share one photovoltaic glass and encapsulation material such as EVA etc. for the encapsulation. First, six columns of solar cell substrings are connected to each other. Next, the power generating unit A and the power generating unit B are connected to each other in parallel to collect currents. Meanwhile, three bypass diodes are provided in the circuit to form a separate loop, so as to prevent the practical power generation capacity of the wafer photovoltaic modules from being reduced.

The inventive concept of the present invention is a unique design of internal protection circuit. Specifically, the current flows out from the middle of the half-cell module. Moreover, three separate junction boxes are used. Each junction box is provided with a diode. Therefore, the half-cell is effectively protected. When the cell string is put in a reverse bias state due to the shadow on the module or other reasons, the practical utilization rate of the half-cell is improved. Similarly, taking the 60-cell mode as an example, the practical utilization rate of the total power generation of the half-cell is about 83%. Compared to the above lateral outgoing method, the power generation capacity of the present invention is about 23% higher. Compared to the above lateral outgoing method, the power generation capacity of the present invention is about 50% higher. Moreover, only three bypass diodes are used. Compared to the lateral outgoing method, one diode is eliminated. Further, the outgoing design with three separate junction boxes shortens the length of the outgoing path of the current of the solar cell, so that the actual loss of current can be greatly reduced. Ultimately, the output power and power generation efficiency of the half-cell module can be effectively improved. Moreover, the procurement costs of the encapsulation material of the modules can be reduced. Therefore, the practical electricity generating capacity of the system side of the modules is greatly improved. Also, the levelized cost of electricity is effectively reduced. In addition, since the number of separated power generating unit increases, the likelihood of failure during the environmental test will be greatly reduced. Particularly, for the temperature-related tests, compared to the conventional half-cell circuit design, the present invention is less likely to fail. Finally, the actual power generation performance and the reliability of outdoor environmental use of the half-cell module products are ensured. Moreover, the half-cell modules using the middle outgoing method are compatible with the operation flow of the conventional photovoltaic module manufacturing process. Only a rotary table should be added to the in-flow and out-flow of the layer stacking station. As for the test of the next step, the power-on position should be slightly changed. Therefore, the manufacturing requirements of the half-cell modules can be met without extra fund investment to modify or upgrade the assembly line. Thus, the present invention is worth spreading vastly.

Figure 1:
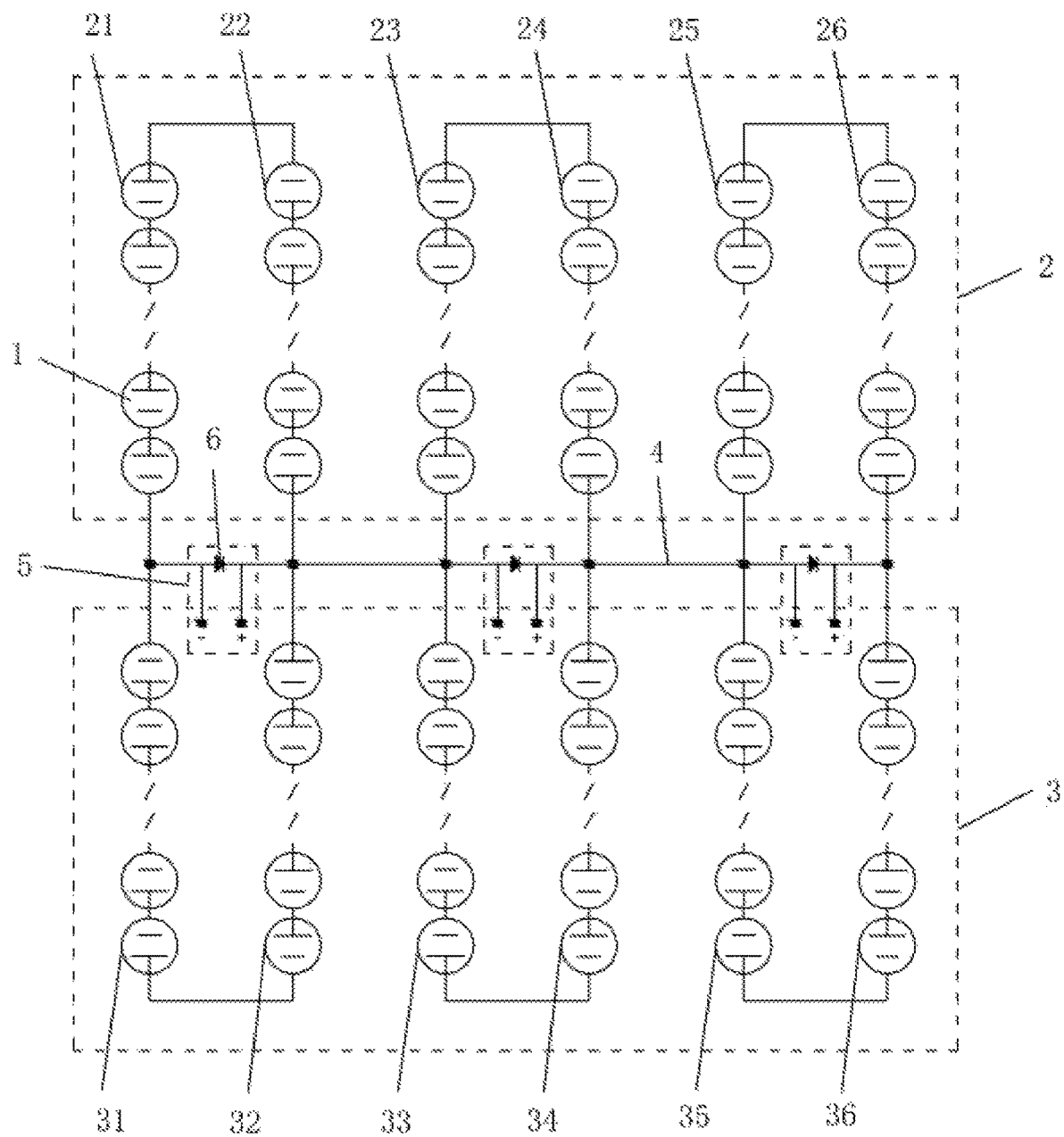
FIG. 1 is a structural schematic view of the internal protection circuit of the present invention.

In the drawings: 1: solar cell; 2: power generating unit A; 21: first column of A; 22: second column of A; 23: third column of A; 24: forth column of A; 25: fifth column of A; 26: sixth column of A; 3: power generating unit B; 31: first column of B; 32: second column of B; 33: third column of B; 34: fourth column of B; 35: fifth column of B; 36: sixth column of B; 4: busbar; 5: separate junction box; 6: diode.

DETAILED DESCRIPTION OF THE INVENTION

The technical solutions in the embodiments of the present invention will be clearly and completely described hereinafter with reference to the drawings in the embodiments of the present invention. Apparently, the described embodiments are merely some rather than all of the embodiments of the present invention. All other embodiments obtained by a person of ordinary skill in the art based on the embodiments of the present invention without creative efforts shall fall within the protection scope of the present invention.

Figure 2:
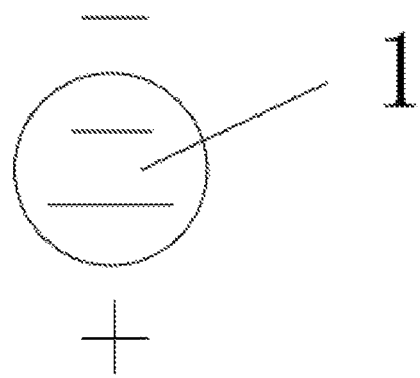
FIG. 2 is a structural schematic diagram of the positive and negative electrodes of the half-cell in the embodiments.

Referring to FIG. 1-2, the present invention provides the following technical solution.

An internal protection circuit structure of photovoltaic modules having independent power generating unit includes a plurality of solar cells 1. As shown in FIG. 2 of the specification, a long line end in the solar cell 1 is a positive electrode, and a short line end is a negative electrode. A plurality of solar cells 1 are combined to form a power generating unit A 2, and a power generating unit B 3. The power generating unit A 2 is equally divided into six columns including a first column of A 21, a second column of A 22, a third column of A 23, a fourth column of A 24, a fifth column of A 25, and a sixth column of A 26, sequentially.

The power generating unit B 3 is equally divided into six columns including a first column of B 31, a second column of B 32, a third column of B 33, a fourth column of B 34, a fifth column of B 35 and a sixth column of B 36, sequentially. The positive and negative electrodes of each column of solar cells are sequentially connected in series to form a substring of the solar cell. As shown in FIG. 1 of the specification, the omitted portion in the middle is a plurality of solar cells 1 combined in series or parallel.

The polarities of the upper ends of the substrings of the solar cells are positive, negative, positive, negative, positive, and negative sequentially from the first column of A 21 to the sixth column of A 26. The upper end of the first column of A 21 and the upper end of the second column of A 22 are connected to each other. The upper end of the third column of A 23 and the upper end of the fourth column of A 24 are connected to each other. The upper end of the fifth column of A 25 and the upper end of the sixth column of A 26 are connected to each other.

The polarities of the lower ends of the substrings of the solar cells are positive, negative, positive, negative, positive, and negative sequentially from the first column of B 31 to the sixth column of B 36. The lower end of the first column of B 31 and the lower end of the second column of B 32 are connected to each other. The lower end of the third column of B 33 and the lower end of the fourth column of B 34 are connected to each other. The lower end of the fifth column of B 35 and the lower end of the sixth column of B 36 are connected to each other.

Six outgoing lines extend from the lower ends of the substrings of solar cells sequentially from the first column of A 21 to the sixth column of A 26. Six outgoing lines extend from the upper ends of the sub strings of solar cells sequentially from the first column of B 31 to the sixth column of B 36. The six outgoing lines of the power generating unit A 2 and six outgoing lines of the power generating unit B 3 are connected to a same busbar 4. Moreover, the busbar 4 is provided with three separate junction boxes 5. Each separate junction box 5 is provided with a diode 6, which can protect the solar cell 1 effectively.

Preferably, the three junction boxes 5 are respectively arranged in the following positions, i.e., a position between the first column of A 21 and the second column of A 22, a position between the third column of A 23 and the fourth column of A 24, and a position between the fifth column of A 25 and the sixth column of A 26. Accordingly, the separate junction boxes 5 can output the outgoing current nicely.

Taking the 60-cell mode as an example, an intact 6-inch cell is divided into two complete and independent small power generating units after being cut by laser with the infrared fiber laser source. A plurality of small power generating units are connected to each other by automatic series welding on an automatic series welding machine based on the number of solar cells connected to each other in one substring. Semi-finished interconnected solar cell substrings are stacked to connect to each other and collect currents based on the internal circuit structure designed in the present invention. Moreover, three separate junction boxes are provided. A single separate junction box contains a bypass diode.

The operation steps of the specific design of the internal protection circuit structure of photovoltaic modules having separate power generating unit are as follows.

1. An intact 6-inch solar cell wafer (generally, the solar cell is face-up and back-down) is taken out from a special carrying case by the carrying robotic arm and is accurately placed in an area designated by a laser scribing apparatus, such that an appearance inspection is performed. The NG solar cells are placed separately, while the qualified solar cells will be passed to the next station for operation.

2. At the laser operating station, the laser scribing machine performs laser cutting on the solar cell based a certain energy ratio setting. The solar cell is cut into a half size. After the cutting is completed, the next step followed by the laser scribing machine has an automatic wafer-slitting (wafer-cracking) function. Moreover, the cut wafers having full function and separate structure are automatically collected in the carrying case used by the series welding machine. Generally, the laser scribing machine also has the function of appearance inspection for the cut solar cell. The NG solar cells are placed separately, while the qualified solar cells are passed to the next station for operation.

3. The cut solar cells are fed based on the welding requirements of the half-cell automatic series welding machine. Visual appearance inspection is performed. Soldering flux is sprayed on the silver paste at the main finger of the solar cell. Meanwhile, the photovoltaic solder strip is flattened, stretched, cut, and laid on the half-cell.

4. The parameters of welding temperature, welding time, the number of interconnected solar cells, the length of reserved photovoltaic solder strip at both ends of the substring, etc. are set based on the parameters of the welding process to complete the automatic welding. After an automatic appearance inspection and an EL inspection of the string, the qualified half-sized cell strings are passed to the automatic typesetting machine in the next step.

5. Since the concept of the present invention is to divide the power generating units based on the conventional half-cell design based on the mode of final parallel output. Namely, one power generating half-cell module is formed by two same and equivalent power generating units connected in parallel. The two units i.e., the power generating unit A and the power generating unit B, are encapsulated on the same piece of tempered glass. The automatic typesetting machine performs automatic typesetting operation based on the polarities of the upper ends of the substrings of the power generating unit A (viewing from the back side of the conventional solar cell encapsulation) which follows the order of positive (+), negative (−), positive (+), negative (−), positive (+), negative (−) and the polarities of the lower ends of the substrings of the power generating unit A which follows the order of negative (−), positive (+), negative (−), positive (+), negative (−), positive (+). The automatic typesetting machine performs automatic typesetting operation based on the polarities of the lower ends of the substrings of the power generating unit B (viewing from the back side of the conventional solar cell encapsulation) which follows the order of positive (+), negative (−), positive (+), negative (−), positive (+), negative (−) and the polarities of the upper ends of the substrings of the power generating unit B which follows the order of negative (−), positive (+), negative (−), positive (+), negative (−), positive (+). Moreover, the interval between the substrings of the solar cells satisfies the requirements of the manufacturing process drawings of the half-cell photovoltaic module. Meanwhile, the power generating unit A and the power generating unit B share the same piece of photovoltaic glass and encapsulating material like EVA for encapsulation.

6. The workers who perform the layer stacking, connect six strings of the power generating unit A in series and pull out six outgoing lines. Moreover, six strings of power generating unit B are connected in series and six outgoing lines are pulled out. In fact, the six outgoing lines of the power generating unit A and the power generating unit B share the same busbar. Moreover, the layer stacking, the typesetting, and the welding are performed based on the finally parallel output mode. Also, a convenient junction box is provided in the middle position on the back side of the module.

7. After the stacked half-finished half-cell module is laminated and trimmed, three separate junction boxes are respectively arranged above and below the short side of the module. Each separate junction box is provided with a bypass diode. Next, curing, cleaning, testing, and product packaging, etc. are performed. In the testing step, an opposite side wiring terminal should be newly added based on the conventional module test.

8. In the system side, the half-cell module uses a vertical mounting method. Compared to the conventional vertical mounting method, the actual electricity generating capacity is increased, and the cable consumption is reduced by 10% accordingly. Thus, the initial investment costs of the photovoltaic plant can be effectively reduced. Meanwhile, since the outgoing path for the collected current is shortened, the power loss of the module encapsulation is also reduced to some extent.

Although the embodiments of the present invention are shown and described, it will be apparent to those skilled in the art that various changes, modifications, substitutions, and alterations can be derived without departing from the principles and spirits of the present invention. The scope of the present invention is defined by the appended claims and their equivalents.

What is claimed is:

1. An internal protection circuit structure of photovoltaic modules having independent power generating unit, comprising:

a plurality of solar cells;

wherein the plurality of solar cells are combined to form a first power generating unit and a second power generating unit;

the first power generating unit is equally divided into six columns including a first column, a second column, a third column, a fourth column, a fifth column, and a sixth column sequentially;

the second power generating unit is equally divided into six columns including a first column, a second column, a third column, a fourth column, a fifth column, and a sixth column sequentially;

positive and negative electrodes of each column of a plurality of solar cells are sequentially connected in series to form a substring of the plurality of solar cells;

a polarity of each upper end of a plurality of substrings of the plurality of solar cells is positive, negative, positive, negative, positive, and negative sequentially from the first column of the first power generating unit to the sixth column of the first power generating unit;

the upper end of the first column of the first power generating unit and the upper end of the second column of the first power generating unit are connected to each other;

the upper end of the third column of the first power generating unit and the upper end of the fourth column of the first power generating unit are connected to each other;

the upper end of the fifth column of the first power generating unit and the upper end of the sixth column of the first power generating unit are connected to each other;

a polarity of each lower end of a plurality of substrings of a plurality of solar cells is positive, negative, positive, negative, positive, and negative sequentially from the first column of the second power generating unit to the sixth column of the second power generating unit;

the lower end of the first column of the second power generating unit and the lower end of the second column of the second power generating unit are connected to each other;

the lower end of the third column of the second power generating unit and the lower end of the fourth column of the second power generating unit are connected to each other;

the lower end of the fifth column of the second power generating unit and the lower end of the sixth column of the second power generating unit are connected to each other;

six outgoing lines extend from the lower ends of the plurality of substrings of the plurality of solar cells from the first column of the first power generating unit to the sixth column of the first power generating unit sequentially;

six outgoing lines extend from the upper ends of the plurality of substrings of the plurality of solar cells from the first column of the second power generating unit to the sixth column of the second power generating unit sequentially;

the six outgoing lines of the first power generating unit and six outgoing lines of the second power generating unit are directly connected to a same busbar; and the busbar is provided with three separate junction boxes.

2. The internal protection circuit structure of photovoltaic modules having independent power generating unit of claim 1, wherein each separate junction box is provided with a diode.

3. The internal protection circuit structure of photovoltaic modules having independent power generating unit of claim 1, wherein the three junction boxes are respectively arranged in the following three positions
- a position between the first column and the second column of the first power generating unit,
- a position between the third column and the fourth column of the first power generating unit, and
- a position between the fifth column and the sixth column of the first power generating unit.

* * * * *